(12) United States Patent
Kim

(10) Patent No.: US 10,418,078 B1
(45) Date of Patent: Sep. 17, 2019

(54) SEMICONDUCTOR DEVICES

(71) Applicant: SK hynix Inc., Icheon-si, Gyeonggi-do (KR)

(72) Inventor: Jaeil Kim, Yongin-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 16/110,489

(22) Filed: Aug. 23, 2018

(30) Foreign Application Priority Data

Feb. 27, 2018 (KR) .......................... 10-2018-0024049

(51) Int. Cl.
    *G11C 7/10* (2006.01)
    *G11C 11/34* (2006.01)
    *G11C 7/22* (2006.01)

(52) U.S. Cl.
    CPC ............ *G11C 7/106* (2013.01); *G11C 7/1057* (2013.01); *G11C 7/1063* (2013.01); *G11C 7/222* (2013.01); *G11C 7/225* (2013.01); *G11C 11/34* (2013.01)

(58) Field of Classification Search
    CPC .......... G11C 7/222; G11C 7/106; G11C 11/34
    USPC ............... 365/230.01, 233.1, 230.09, 233.11
    See application file for complete search history.

(56) References Cited

U.S. PATENT DOCUMENTS

| 8,006,057 | B2 | 8/2011 | LaBerge | |
| 2018/0121123 | A1* | 5/2018 | Morris | G11C 29/028 |
| 2018/0122486 | A1* | 5/2018 | Choi | G11C 7/222 |

FOREIGN PATENT DOCUMENTS

KR      1020170045058 A      4/2017

* cited by examiner

*Primary Examiner* — Han Yang
(74) *Attorney, Agent, or Firm* — William Park & Associates Ltd.

(57) ABSTRACT

A semiconductor device may include a multipurpose command latch circuit, a latched control signal generation circuit, and a training control circuit. The multipurpose command latch circuit may be configured to synchronize a multipurpose command with a first division clock signal to generate a first latched multipurpose command. The latched control signal generation circuit may be configured to latch a control signal in synchronization with the first division clock signal to generate a first latched control signal. The training control circuit may be configured to generate a training signal for executing a training operation of a chip selection signal from a first latched multipurpose command and a first latched control signal based on a training flag.

20 Claims, 15 Drawing Sheets

SEMICONDUCTOR DEVICES

CROSS-REFERENCE TO RELATED APPLICATIONS

The present application claims priority under 35 U.S.C 119(a) to Korean Application No. 10-2018-0024049, filed on Feb. 27, 2018, which is incorporated herein by reference in its entirety.

BACKGROUND

1. Technical Field

Embodiments of the present disclosure generally relate to semiconductor devices executing a training operation.

2. Related Art

Mobile systems such as portable computers, personal digital assistants (PDAs) and mobile phones have been developed to reduce the weight thereof for portability. Batteries supplying electric power to the mobile systems may largely affect the total weight of the mobile systems. If power consumption of semiconductor devices employed in the mobile systems is lowered, the capacity of the batteries may also be reduced to thus decrease the total weight of the mobile systems. Fast mobile systems are increasingly in demand with the development of multi-functional mobile systems. Accordingly, data transmission speeds of the semiconductor devices such as mobile memory devices (also, referred to as 'mobile memory chips') may be important factors in determining operation speeds of the high performance mobile systems.

Recently, the semiconductor devices have been designed to simultaneously receive a command and an address through a plurality of pins. In such a case, signals inputted to each semiconductor device through the plurality of pins may include all information on the command and the address, and a command decoder and an address decoder may decode the singles inputted through the plurality of pins to extract the command and the address.

In case of synchronous semiconductor devices, the command and the address may be inputted in synchronization with a clock signal. For example, double data rate (DDR) semiconductor devices may receive the command and the address in synchronization with a rising edge and a falling edge of the clock signal, and single data rate (SDR) semiconductor devices may receive the command and the address in synchronization with a rising edge of the clock signal.

SUMMARY

According to an embodiment, a semiconductor device may include a training control circuit configured to generate a training signal for executing a training operation of a chip selection signal from a first latched multipurpose command and a first latched control signal. The training control circuit may be configured to delay the first latched multipurpose command to generate a first delayed multipurpose command and a second delayed multipurpose command. If a multipurpose command is enabled during a period corresponding to "N" times a cycle time of a clock signal, the training control circuit may be configured to decode the first latched control signal to generate a first training entry signal and configured to generate the training signal which is enabled from the first latched multipurpose command in response to the first training entry signal. If the multipurpose command is enabled during a period corresponding to the cycle time of the clock signal, the training control circuit may be configured to latch the first latched control signal in response to the first delayed multipurpose command, configured to decode the latched signal of the first latched control signal to generate the first training entry signal, and configured to generate the training signal which is enabled from the second delayed multipurpose command in response to the first training entry signal.

According to another embodiment, a semiconductor device may include a multipurpose command latch circuit, a latched control signal generation circuit, and a training control circuit. The multipurpose command latch circuit may be configured to synchronize a multipurpose command with a first division clock signal to generate a first latched multipurpose command. The latched control signal generation circuit may be configured to latch a control signal in synchronization with the first division clock signal to generate a first latched control signal. The training control circuit may be configured to generate a training signal for executing a training operation of a chip selection signal from a first latched multipurpose command and a first latched control signal based on a training flag.

DETAILED DESCRIPTION

Various embodiments will be described hereinafter with reference to the accompanying drawings. However, the embodiments described herein are for illustrative purposes only and are not intended to limit the scope of the present disclosure.

Figure 1:
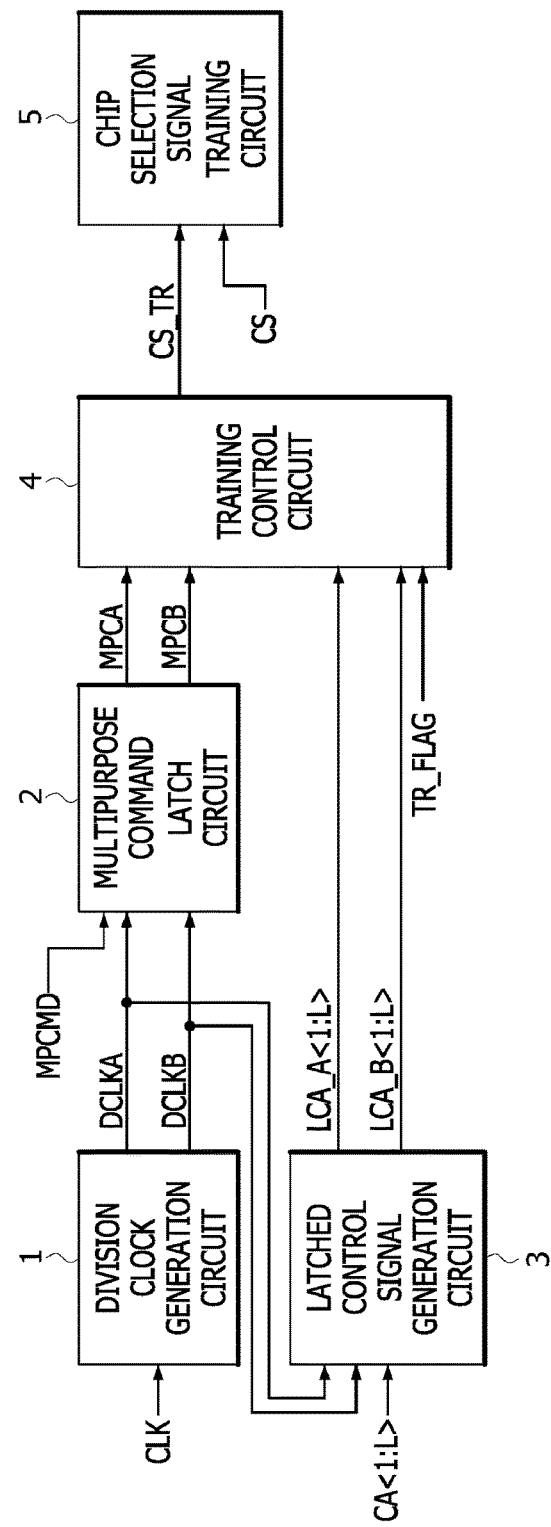
FIG. 1 is a block diagram illustrating a configuration of a semiconductor device in accordance with an embodiment.

As illustrated in FIG. 1, a semiconductor device according to an embodiment may include a division clock generation circuit 1, a multipurpose command latch circuit 2, a latched control signal generation circuit 3, a training control circuit 4, and a chip selection signal training circuit 5.

The division clock generation circuit 1 may generate a first division clock signal DCLKA and a second division clock signal DCLKB in response to a clock signal CLK. The division clock generation circuit 1 may receive and buffer the clock signal CLK and may divide the buffered clock signal to generate the first division clock signal DCLKA and the second division clock signal DCLKB. The first and second division clock signals DCLKA and DCLKB may be generated to have a cycle time which is "N" times a cycle time of the clock signal CLK and an internal clock signal (ICLK of FIG. 2). A configuration and an operation of the division clock generation circuit 1 will be described below with reference to FIG. 2 later.

The multipurpose command latch circuit 2 may generate a first latched multipurpose command MPCA and a second latched multipurpose command MPCB from the first and second division clock signals DCLKA and DCLKB in response to a multipurpose command MPCMD. The multipurpose command latch circuit 2 may latch the first division clock signal DCLKA to output the latched first division clock signal as the first latched multipurpose command MPCA while the multipurpose command MPCMD is enabled. The multipurpose command latch circuit 2 may latch the second division clock signal DCLKB to output the latched second division clock signal as the second latched multipurpose command MPCB while the multipurpose command MPCMD is enabled. The multipurpose command MPCMD may be a signal which is stored in the semiconductor device.

Alternatively, the multipurpose command MPCMD may be a signal which is included in a control signal CA<1:L> that is inputted to the semiconductor device. A configuration and an operation of the multipurpose command latch circuit 2 will be described below with reference to FIG. 3 later.

The latched control signal generation circuit 3 may generate a first latched control signal LCA_A<1:L> and a second latched control signal LCA_B<1:L> from the control signal CA<1:L> in response to the first and second division clock signals DCLKA and DCLKB. The latched control signal generation circuit 3 may latch the control signal CA<1:L> in synchronization with the first division clock signal DCLKA to output the latched control signal as the first latched control signal LCA_A<1:L>. The latched control signal generation circuit 3 may latch the control signal CA<1:L> in synchronization with the second division clock signal DCLKB to output the latched control signal as the second latched control signal LCA_B<1:L>. The control signal CA<1:L> may include at least one of a command and an address. The number "L" of bits included in the control signal CA<1:L> and the first and second latched control signals LCA_A<1:L> and LCA_B<1:L> may be set to be different according to various embodiments. A configuration and an operation of the latched control signal generation circuit 3 will be described below with reference to FIG. 4 later.

The training control circuit 4 may generate a training signal CS_TR from the first and second latched multipurpose commands MPCA and MPCB and the first and second latched control signals LCA_A<1:L> and LCA_B<1:L> in response to a training flag TR_FLAG. The training flag TR_FLAG may be set to have a first logic level if the multipurpose command MPCMD is enabled during a period corresponding to "N" times a cycle time of the clock signal CLK and may be set to have a second logic level if the multipurpose command MPCMD is enabled during a period corresponding to a cycle time of the clock signal CLK. In an embodiment, the first logic level may be set to be a logic "high" level and the second logic level may be set to be a logic "low" level. However, in some other embodiments, the first and second logic levels may be set to be different.

The training control circuit 4 may generate the training signal CS_TR from the first latched multipurpose command MPCA and the first latched control signal LCA_A<1:L> in response to the training flag TR_FLAG. If the training flag TR_FLAG has the first logic level, the training control circuit 4 may latch the first latched control signal LCA_A<1:L> at a generation moment of the first latched multipurpose command MPCA and may decode the latched signal to generate the training signal CS_TR whose enablement period is set. If the training flag TR_FLAG has the second logic level, the training control circuit 4 may latch the first latched control signal LCA_A<1:L> at a point of time that a predetermined delay time elapses from a generation moment of the first latched multipurpose command MPCA and may decode the latched signal to generate the training signal CS_TR whose enablement period is set.

The training control circuit 4 may generate the training signal CS_TR from the second latched multipurpose command MPCB and the second latched control signal LCA_B<1:L> in response to the training flag TR_FLAG. If the training flag TR_FLAG has the first logic level, the training control circuit 4 may latch the second latched control signal LCA_B<1:L> at a generation moment of the second latched multipurpose command MPCB and may decode the latched signal to generate the training signal CS_TR whose enablement period is set. If the training flag TR_FLAG has the second logic level, the training control circuit 4 may latch the second latched control signal LCA_B<1:L> at a point of time that a predetermined delay time elapses from a generation moment of the second latched multipurpose command MPCB and may decode the latched signal to generate the training signal CS_TR whose enablement period is set. A configuration and an operation of the training control circuit 4 will be described below with reference to FIGS. 5 to 12 later.

The chip selection signal training circuit 5 may receive a chip selection signal CS to execute a training operation, in response to the training signal CS_TR. The chip selection signal training circuit 5 may execute the training operation of the chip selection signal CS if the training signal CS_TR is enabled. The training operation of the chip selection signal CS may be executed using a scheme that controls an application timing of the chip selection signal CS to verify a period that the chip selection signal CS is stably applied.

Figure 2:
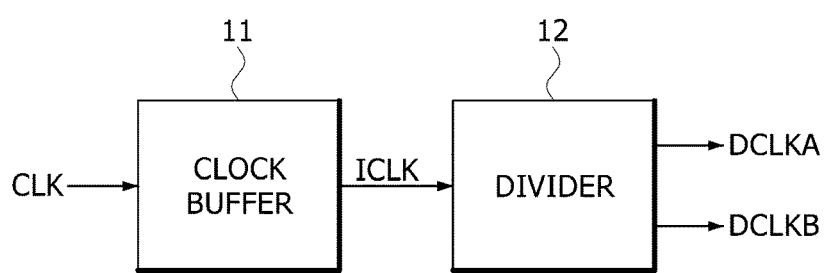
FIG. 2 is a block diagram illustrating a configuration of an example of a division clock generation circuit included in the semiconductor device of FIG. 1.

Referring to FIG. 2, the division clock generation circuit 1 may include a clock buffer 11 and a divider 12. The clock buffer 11 may generate the internal clock signal ICLK from the clock signal CLK. The clock buffer 11 may buffer the clock signal CLK to output the buffered clock signal as the internal clock signal ICLK. The clock buffer 11 may be realized using a buffering circuit. The divider 12 may generate the first and second division clock signals DCLKA and DCLKB from the internal clock signal ICLK. The first and second division clock signals DCLKA and DCLKB may be generated to have a cycle time which is "N" times a cycle time of the internal clock signal ICLK and the clock signal CLK.

Figure 3:
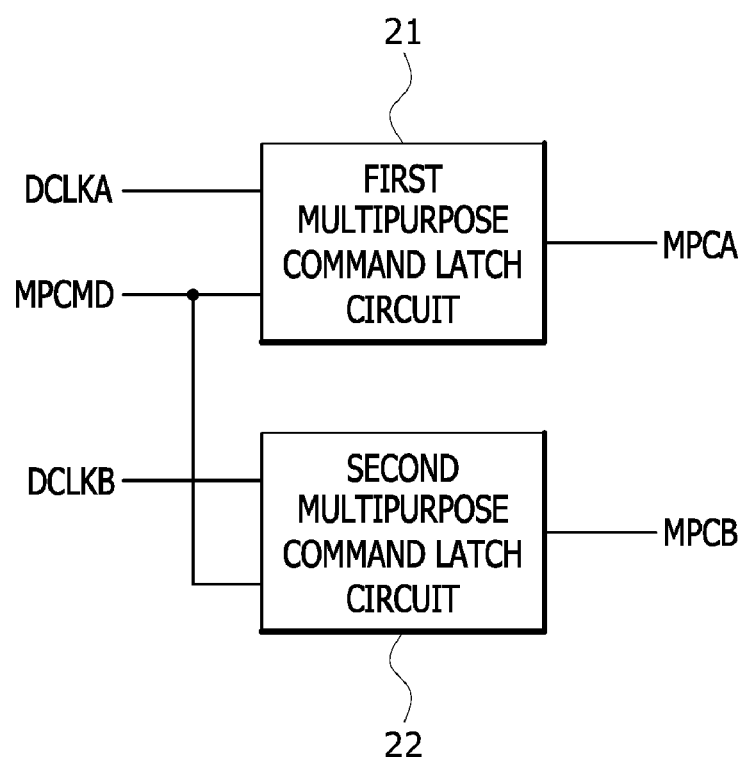
FIG. 3 is a block diagram illustrating a configuration of an example of a multipurpose command latch circuit included in the semiconductor device of FIG. 1.

Referring to FIG. 3, the multipurpose command latch circuit 2 may include a first multipurpose command latch circuit 21 and a second multipurpose command latch circuit 22. The first multipurpose command latch circuit 21 may generate the first latched multipurpose command MPCA from the first division clock signal DCLKA in response to the multipurpose command MPCMD.

The first multipurpose command latch circuit 21 may latch the first division clock signal DCLKA to output the latched first division clock signal as the first latched multipurpose command MPCA while the multipurpose command MPCMD is enabled to have a logic "high" level. The second multipurpose command latch circuit 22 may generate the second latched multipurpose command MPCB from the second division clock signal DCLKB in response to the multipurpose command MPCMD. The second multipurpose command latch circuit 22 may latch the second division clock signal DCLKB to output the latched second division clock signal as the second latched multipurpose command MPCB while the multipurpose command MPCMD is enabled to have a logic "high" level.

Figure 4:
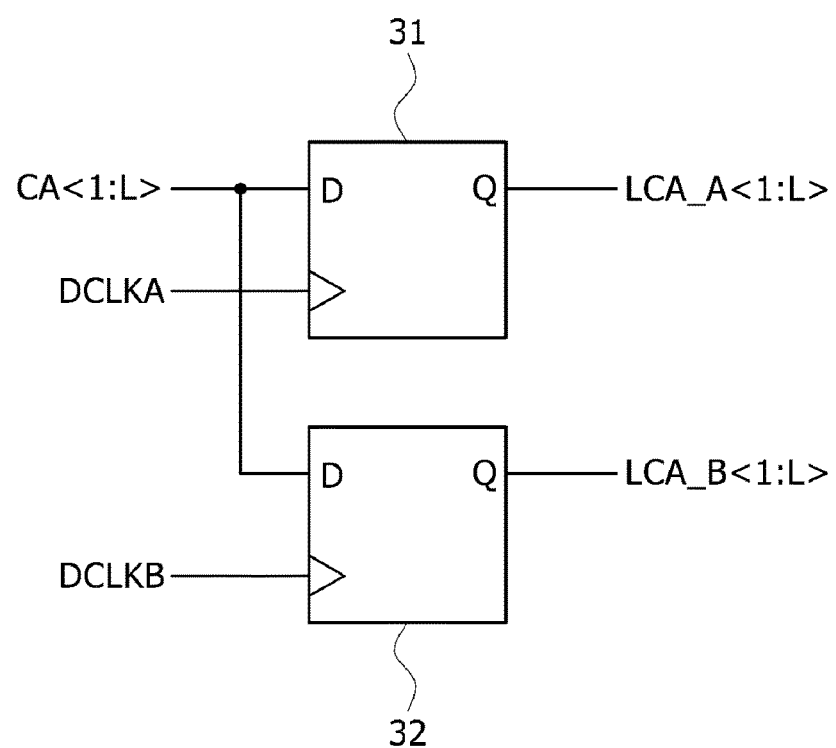
FIG. 4 is a circuit diagram illustrating a configuration of an example of a latched control signal generation circuit included in the semiconductor device of FIG. 1.

Referring to FIG. 4, the latched control signal generation circuit 3 may include flip-flops 31 and 32. The flip-flop 31 may generate the first latched control signal LCA_A<1:L> from the control signal CA<1:L> in response to the first division clock signal DCLKA. The flip-flop 31 may latch the control signal CA<1:L> in synchronization with a rising edge of the first division clock signal DCLKA to output the latched control signal as the first latched control signal LCA_A<1:L>. The rising edge of the first division clock signal DCLKA means a point of time that a level of the first division clock signal DCLKA changes from a logic "low" level into a logic "high" level. The flip-flop 32 may generate the second latched control signal LCA_B<1:L> from the control signal CA<1:L> in response to the second division clock signal DCLKB. The flip-flop 32 may latch the control signal CA<1:L> in synchronization with a rising edge of the second division clock signal DCLKB to output the latched control signal as the second latched control signal LCA_B<1:L>. The rising edge of the second division clock signal DCLKB means a point of time that a level of the second division clock signal DCLKB changes from a logic "low" level into a logic "high" level.

Figure 5:
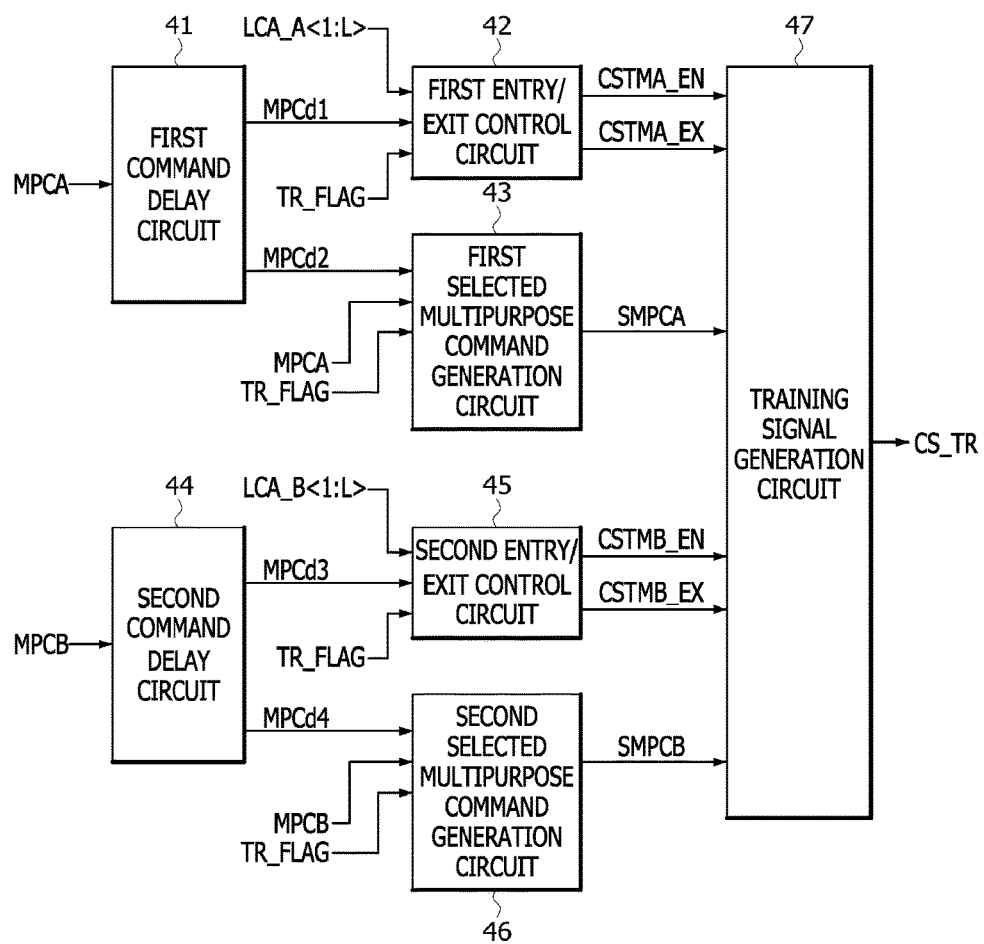
FIG. 5 is a block diagram illustrating a configuration of an example of a training control circuit included in the semiconductor device of FIG. 1.

Referring to FIG. 5, the training control circuit 4 may include a first command delay circuit 41, a first entry/exit control circuit 42, a first selected multipurpose command generation circuit 43, a second command delay circuit 44, a second entry/exit control circuit 45, a second selected multipurpose command generation circuit 46, and a training signal generation circuit 47.

The first command delay circuit 41 may delay the first latched multipurpose command MPCA to generate a first delayed multipurpose command MPCd1 and a second delayed multipurpose command MPCd2. The first command delay circuit 41 may delay the first latched multipurpose command MPCA by a predetermined period to generate the first delayed multipurpose command MPCd1. The first command delay circuit 41 may delay the first delayed multipurpose command MPCd1 by a predetermined period to generate the second delayed multipurpose command MPCd2. A configuration and an operation of the first command delay circuit 41 will be described below with reference to FIG. 6 later.

The first entry/exit control circuit 42 may generate a first training entry signal CSTMA_EN and a first training exit signal CSTMA_EX in response to the first latched control signal LCA_A<1:L>, the first delayed multipurpose command MPCd1, and the training flag TR_FLAG. The first entry/exit control circuit 42 may decode the first latched control signal LCA_A<1:L> to generate the first training entry signal CSTMA_EN and the first training exit signal CSTMA_EX if the training flag TR_FLAG has a first logic level. In an embodiment, the first logic level may be a logic "high" level. The first logic level may be set to be different according to various embodiments. The first training entry signal CSTMA_EN and the first training exit signal CSTMA_EX may be enabled according to a logic level combination of the first latched control signal LCA_A<1:L>. A logic level combination of the first latched control signal LCA_A<1:L> for enabling the first training entry signal CSTMA_EN and a logic level combination of the first latched control signal LCA_A<1:L> for enabling the first training exit signal CSTMA_EX may be set to be identical to each other or to be different from each other according to various embodiments. Logic levels of the first training entry signal CSTMA_EN and the first training exit signal CSTMA_EX which are enabled may be set to be different according to various embodiments. The first entry/exit control circuit 42 may decode a delayed signal of the first latched control signal LCA_A<1:L> to generate the first training entry signal CSTMA_EN and the first training exit signal CSTMA_EX if the training flag TR_FLAG has a second logic level. In an embodiment, the second logic level may be a logic "low" level. The second logic level may be set to be different according to various embodiments. A configuration and an operation of the first entry/exit control circuit 42 will be described below with reference to FIG. 7 later.

The first selected multipurpose command generation circuit 43 may generate a first selected multipurpose command SMPCA in response to the training flag TR_FLAG, the first latched multipurpose command MPCA, and the second delayed multipurpose command MPCd2. The first selected multipurpose command generation circuit 43 may output the first latched multipurpose command MPCA as the first selected multipurpose command SMPCA if the training flag TR_FLAG has a first logic level. In an embodiment, the first logic level may be a logic "high" level. The first logic level may be set to be different according to various embodiments. The first selected multipurpose command generation circuit 43 may output the second delayed multipurpose command MPCd2 as the first selected multipurpose command SMPCA if the training flag TR_FLAG has a second logic level. In an embodiment, the second logic level may be a logic "low" level. The second logic level may be set to be different according to various embodiments. A configuration and an operation of the first selected multipurpose command generation circuit 43 will be described below with reference to FIG. 8 later.

The second command delay circuit 44 may delay the second latched multipurpose command MPCB to generate a third delayed multipurpose command MPCd3 and a fourth delayed multipurpose command MPCd4. The second command delay circuit 44 may delay the second latched multipurpose command MPCB by a predetermined period to generate the third delayed multipurpose command MPCd3. The second command delay circuit 44 may delay the third delayed multipurpose command MPCd3 by a predetermined period to generate the fourth delayed multipurpose command MPCd4. A configuration and an operation of the second command delay circuit 44 will be described below with reference to FIG. 9 later.

The second entry/exit control circuit 45 may generate a second training entry signal CSTMB_EN and a second training exit signal CSTMB_EX in response to the second latched control signal LCA_B<1:L>, the third delayed multipurpose command MPCd3, and the training flag TR_FLAG. The second entry/exit control circuit 45 may decode the second latched control signal LCA_B<1:L> to generate the second training entry signal CSTMB_EN and the second training exit signal CSTMB_EX if the training flag TR_FLAG has a first logic level. In an embodiment, the first logic level may be a logic "high" level. The first logic level may be set to be different according to various embodiments. The second training entry signal CSTMB_EN and the second training exit signal CSTMB_EX may be enabled according to a logic level combination of the second latched control signal LCA_B<1:L>. A logic level combination of the second latched control signal LCA_B<1:L> for enabling the second training entry signal CSTMB_EN and a logic level combination of the second latched control signal LCA_B<1:L> for enabling the second training exit signal CSTMB_EX may be set to be identical to each other or to be different from each other according to various embodiments. Logic levels of the second training entry signal CSTMB_EN and the second training exit signal CSTMB_EX which are enabled may be set to be different according to various embodiments. The second entry/exit control circuit 45 may decode a delayed signal of the second latched control signal LCA_B<1:L> to generate the second training entry signal CSTMB_EN and the second training exit signal CSTMB_EX if the training flag TR_FLAG has a second logic level. In an embodiment, the second logic level may be a logic "low" level. The second logic level may be set to be different according to various embodiments. A configuration and an operation of the second entry/exit control circuit 45 will be described below with reference to FIG. 10 later.

The second selected multipurpose command generation circuit 46 may generate a second selected multipurpose command SMPCB in response to the training flag TR_FLAG, the second latched multipurpose command MPCB, and the fourth delayed multipurpose command MPCd4. The second selected multipurpose command generation circuit 46 may output the second latched multipurpose command MPCB as the second selected multipurpose command SMPCB if the training flag TR_FLAG has a first logic level. In an embodiment, the first logic level may be a logic "high" level. The first logic level may be set to be different according to various embodiments. The second selected multipurpose command generation circuit 46 may output the fourth delayed multipurpose command MPCd4 as the second selected multipurpose command SMPCB if the training flag TR_FLAG has a second logic level. In an embodiment, the second logic level may be a logic "low" level. The second logic level may be set to be different according to various embodiments. A configuration and an operation of the second selected multipurpose command generation circuit 46 will be described below with reference to FIG. 11 later.

The training signal generation circuit 47 may generate the training signal CS_TR in response to the first training entry signal CSTMA_EN, the first selected multipurpose command SMPCA, the second training entry signal CSTMB_EN, the second selected multipurpose command SMPCB, the first training exit signal CSTMA_EX, and the second training exit signal CSTMB_EX. The training signal generation circuit 47 may generate the training signal CS_TR in response to the first training entry signal CSTMA_EN, the first selected multipurpose command SMPCA, the second training entry signal CSTMB_EN, and the second selected multipurpose command SMPCB. The training signal generation circuit 47 may generate the training signal CS_TR whose enablement moment is determined by the first training entry signal CSTMA_EN while the first selected multipurpose command SMPCA is generated or by the second training entry signal CSTMB_EN while the second selected multipurpose command SMPCB is generated. The training signal generation circuit 47 may generate the training signal CS_TR in response to the first training exit signal CSTMA_EX, the first selected multipurpose command SMPCA, the second training exit signal CSTMB_EX, and the second selected multipurpose command SMPCB. The training signal generation circuit 47 may generate the training signal CS_TR whose disablement moment is determined by the first training exit signal CSTMA_EX while the first selected multipurpose command SMPCA is generated or by the second training exit signal CSTMB_EX while the second selected multipurpose command SMPCB is generated. A configuration and an operation of the training signal generation circuit 47 will be described below with reference to FIG. 12 later.

Figure 6:
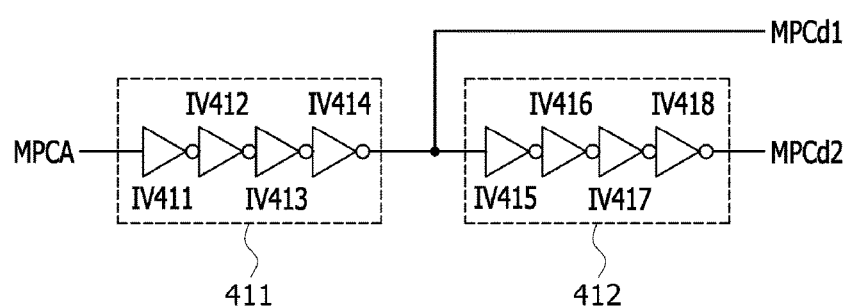
FIG. 6 is a circuit diagram illustrating a configuration of an example of a first command delay circuit included in the training control circuit of FIG. 5.

Referring to FIG. 6, the first command delay circuit 41 may include delay circuits 411 and 412. The delay circuit 411 may include inverters IV411~IV414. The delay circuit 411 may delay the first latched multipurpose command MPCA by a period, which is set by the inverters IV411~IV414, to generate the first delayed multipurpose command MPCd1. The delay circuit 412 may include inverters IV415~IV418. The delay circuit 412 may delay the first delayed multipurpose command MPCd1 by a period, which is set by the inverters IV415~IV418, to generate the second delayed multipurpose command MPCd2.

Figure 7:
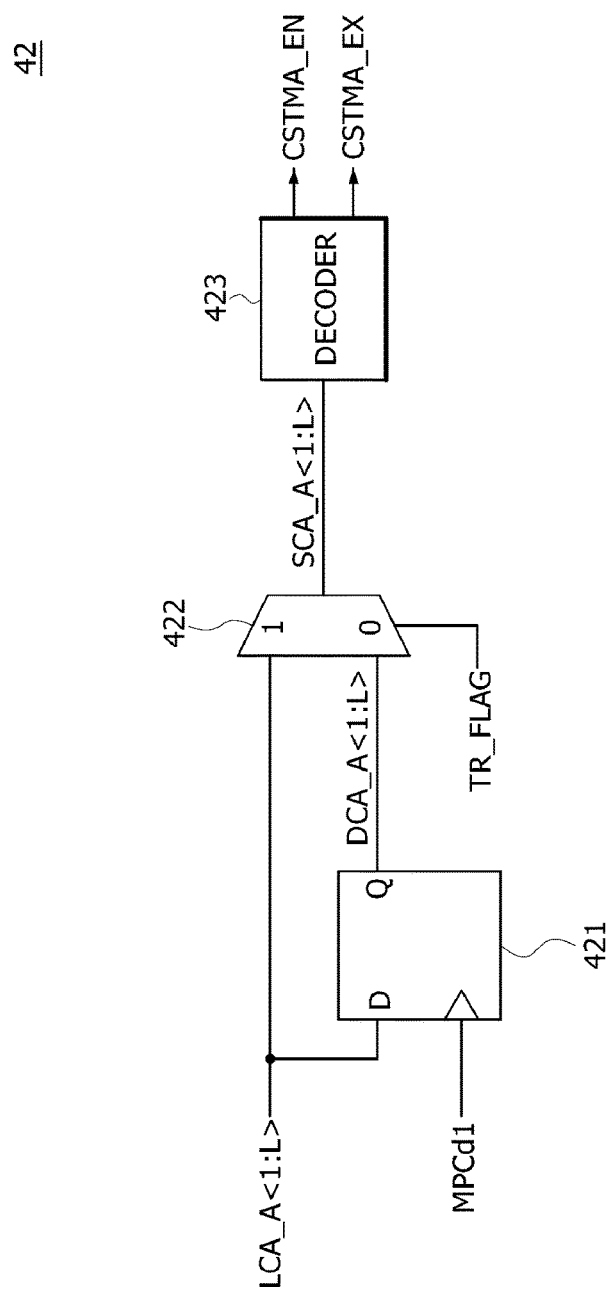
FIG. 7 is a block diagram illustrating a configuration of an example of a first entry/exit control circuit included in the training control circuit of FIG. 5.

Referring to FIG. 7, the first entry/exit control circuit 42 may include a flip-flop 421, a selector 422, and a decoder 423. The flip-flop 421 may generate a first delayed control signal DCA_A<1:L> from the first latched control signal LCA_A<1:L> in response to the first delayed multipurpose command MPCd1. The flip-flop 421 may latch the first latched control signal LCA_A<1:L> in synchronization with a rising edge of the first delayed multipurpose command MPCd1 to output the latched signal as the first delayed control signal DCA_A<1:L>. The selector 422 may generate a first selected control signal SCA_A<1:L> from the first latched control signal LCA_A<1:L> or the first delayed control signal DCA_A<1:L> in response to the training flag TR_FLAG. The selector 422 may output the first latched control signal LCA_A<1:L> as the first selected control signal SCA_A<1:L> if the multipurpose command MPCMD is enabled during a period corresponding to "N" times a cycle time of the clock signal CLK so that the training flag TR_FLAG is set to have a logic "high" level. The selector 422 may output the first delayed control signal DCA_A<1:L> as the first selected control signal SCA_A<1:L> if the multipurpose command MPCMD is enabled during a period corresponding to a cycle time of the clock signal CLK so that the training flag TR_FLAG is set to have a logic "low" level. The decoder 423 may decode the first selected control signal SCA_A<1:L> to generate the first training entry signal CSTMA_EN and the first training exit signal CSTMA_EX. A logic level combination of the first selected control signal SCA_A<1:L> for enabling the first training entry signal CSTMA_EN and a logic level combination of the first selected control signal SCA_A<1:L> for enabling the first training exit signal CSTMA_EX may be set to be different according to various embodiments.

Figure 8:
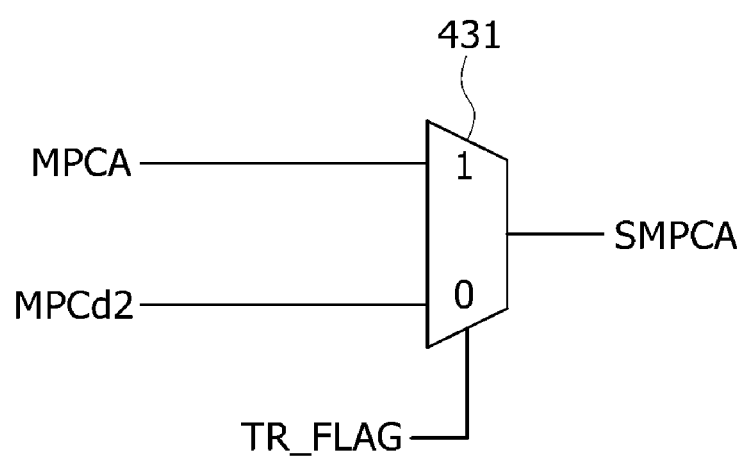
FIG. 8 is a block diagram illustrating a configuration of an example of a first selection multipurpose command generation circuit included in the training control circuit of FIG. 5.

Referring to FIG. 8, the first selected multipurpose command generation circuit 43 may include a selector 431. The selector 431 may generate the first selected multipurpose command SMPCA from the first latched multipurpose command MPCA or the second delayed multipurpose command MPCd2 in response to the training flag TR_FLAG. The selector 431 may output the first latched multipurpose command MPCA as the first selected multipurpose command SMPCA if the multipurpose command MPCMD is enabled during a period corresponding to "N" times a cycle time of the clock signal CLK so that the training flag TR_FLAG is set to have a logic "high" level. The selector 431 may output the second delayed multipurpose command MPCd2 as the first selected multipurpose command SMPCA if the multipurpose command MPCMD is enabled during a period corresponding to a cycle time of the clock signal CLK so that the training flag TR_FLAG is set to have a logic "low" level.

Figure 9:
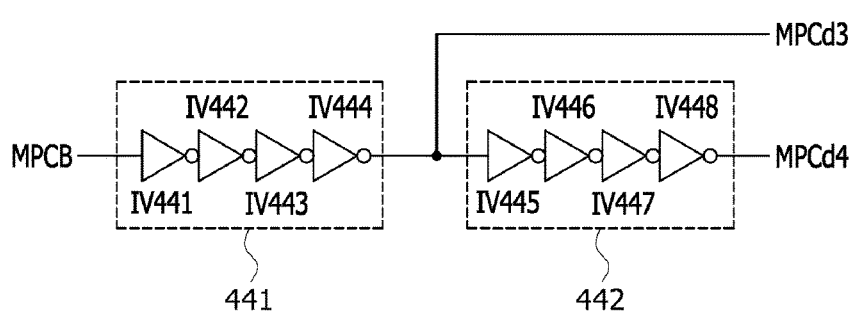
FIG. 9 is a circuit diagram illustrating a configuration of an example of a second command delay circuit included in the training control circuit of FIG. 5.

Referring to FIG. 9, the second command delay circuit 44 may include delay circuits 441 and 442. The delay circuit 441 may include inverters IV441~IV444. The delay circuit 441 may delay the second latched multipurpose command MPCB by a period, which is set by the inverters IV441~IV444, to generate the third delayed multipurpose command MPCd3. The delay circuit 442 may include inverters IV445~IV448. The delay circuit 442 may delay the third delayed multipurpose command MPCd3 by a period, which is set by the inverters IV445~IV448, to generate the fourth delayed multipurpose command MPCd4.

Figure 10:
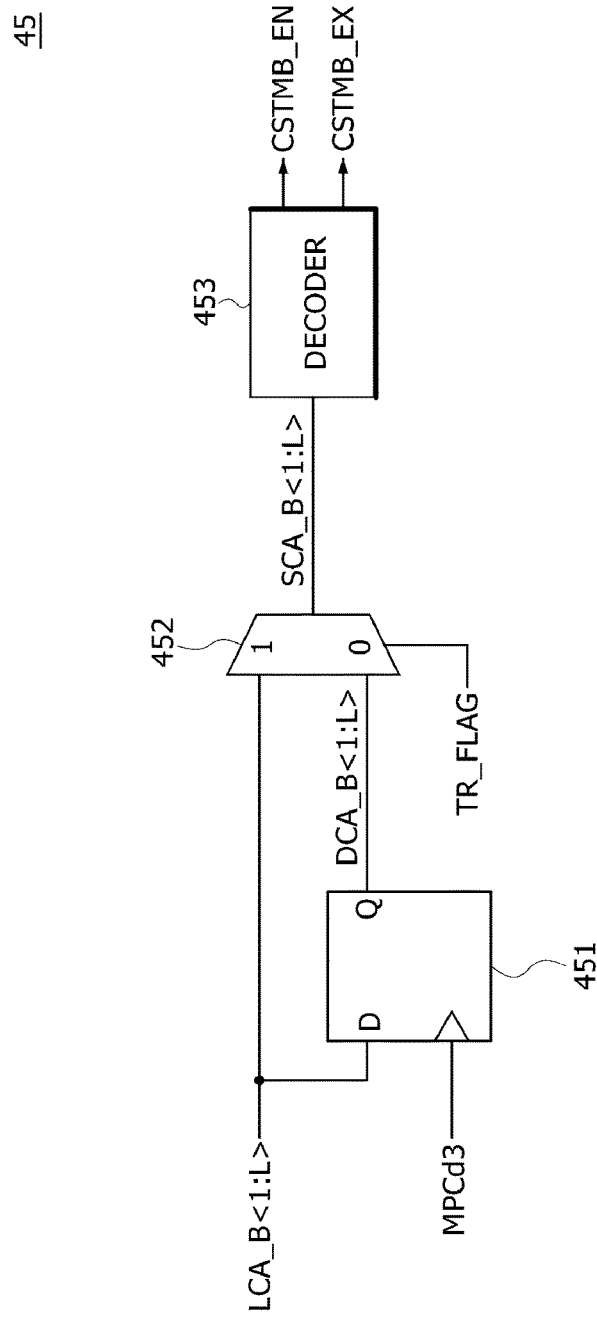
FIG. 10 is a block diagram illustrating a configuration of an example of a second entry/exit control circuit included in the training control circuit of FIG. 5.

Referring to FIG. 10, the second entry/exit control circuit 45 may include a flip-flop 451, a selector 452, and a decoder 453. The flip-flop 451 may generate a second delayed control signal DCA_B<1:L> from the second latched control signal LCA_B<1:L> in response to the third delayed multipurpose command MPCd3. The flip-flop 451 may latch the second latched control signal LCA_B<1:L> in synchronization with a rising edge of the third delayed multipurpose command MPCd3 to output the latched signal as the second delayed control signal DCA_B<1:L>. The selector 452 may generate a second selected control signal SCA_B<1:L> from the second latched control signal LCA_B<1:L> or the second delayed control signal DCA_B<1:L> in response to the training flag TR_FLAG. The selector 452 may output the second latched control signal LCA_B<1:L> as the second selected control signal SCA_B<1:L> if the multipurpose command MPCMD is enabled during a period corresponding to "N" times a cycle time of the clock signal CLK so that the training flag TR_FLAG is set to have a logic "high" level. The selector 452 may output the second delayed control signal DCA_B<1:L> as the second selected control signal SCA_B<1:L> if the multipurpose command MPCMD is enabled during a period corresponding to a cycle time of the clock signal CLK so that the training flag TR_FLAG is set to have a logic "low" level. The decoder 453 may decode the second selected control signal SCA_B<1:L> to generate the second training entry signal CSTMB_EN and the second training exit signal CSTMB_EX. A logic level combination of the second selected control signal SCA_B<1:L> for enabling the second training entry signal CSTMB_EN and a logic level combination of the second selected control signal SCA_B<1:L> for enabling the second training exit signal CSTMB_EX may be set to be different according to various embodiments.

Figure 11:
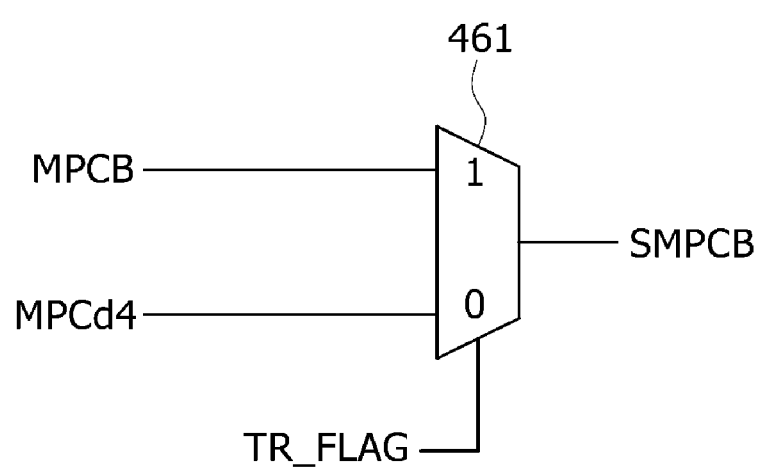
FIG. 11 is a block diagram illustrating a configuration of an example of a second selection multipurpose command generation circuit included in the training control circuit of FIG. 5.

Referring to FIG. 11, the second selected multipurpose command generation circuit 46 may include a selector 461. The selector 461 may generate the second selected multipurpose command SMPCB from the second latched multipurpose command MPCB or the fourth delayed multipurpose command MPCd4 in response to the training flag TR_FLAG. The selector 461 may output the second latched multipurpose command MPCB as the second selected multipurpose command SMPCB if the multipurpose command MPCMD is enabled during a period corresponding to "N" times a cycle time of the clock signal CLK so that the training flag TR_FLAG is set to have a logic "high" level. The selector 461 may output the fourth delayed multipurpose command MPCd4 as the second selected multipurpose command SMPCB if the multipurpose command MPCMD is enabled during a period corresponding to a cycle time of the clock signal CLK so that the training flag TR_FLAG is set to have a logic "low" level.

Figure 12:
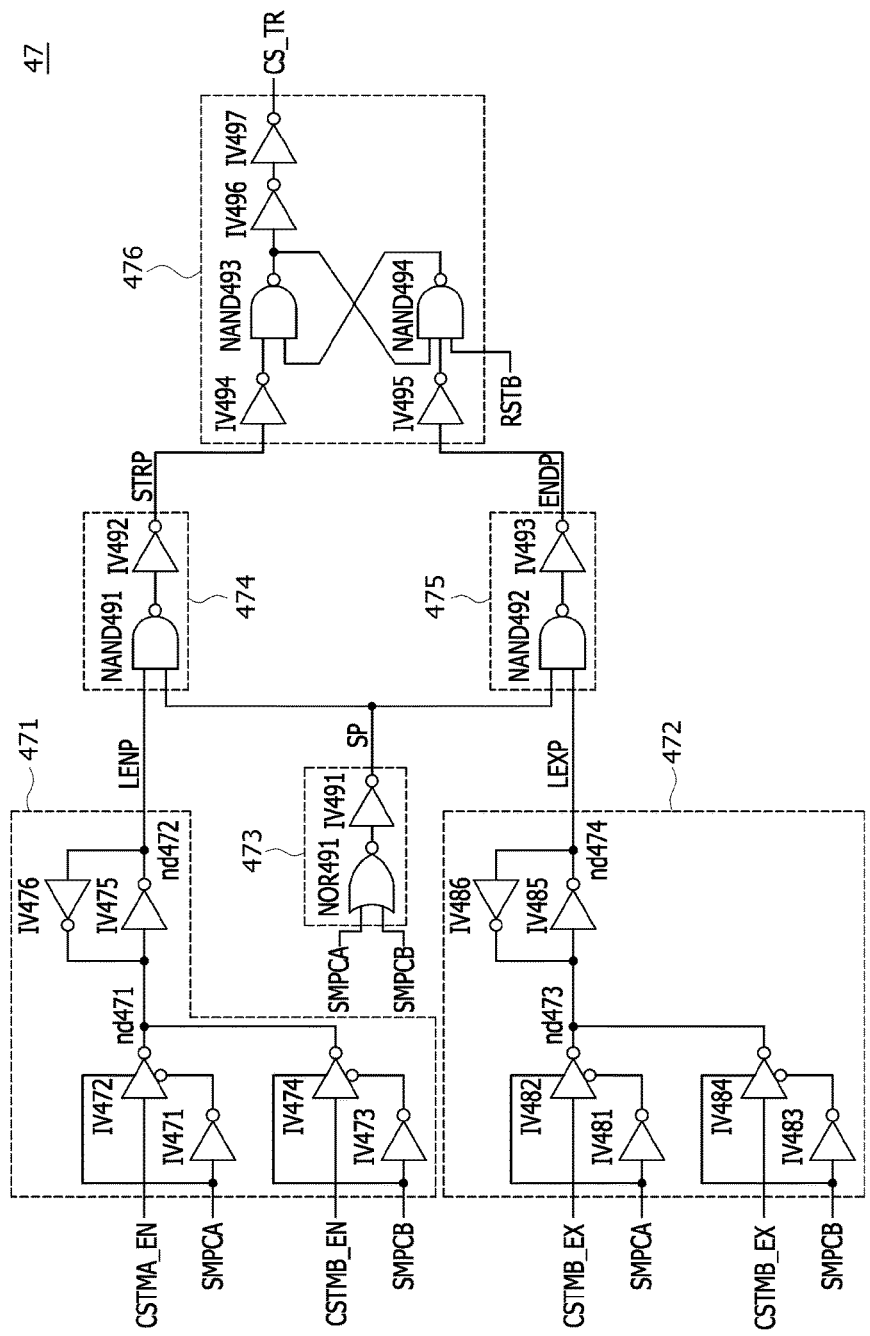
FIG. 12 is a circuit diagram illustrating a configuration of an example of a training signal generation circuit included in the training control circuit of FIG. 5.

Referring to FIG. 12, the training signal generation circuit 47 may include a latch entry pulse generation circuit 471, a latch exit pulse generation circuit 472, a strobe pulse generation circuit 473, a start pulse generation circuit 474, an end pulse generation circuit 475, and a training signal output circuit 476.

The latch entry pulse generation circuit 471 may include inverters IV471~IV476. The inverter IV471 may inversely buffer the first selected multipurpose command SMPCA and may output the inversely buffered signal as an output signal. The inverter IV472 may inversely buffer the first training entry signal CSTMA_EN to output the inversely buffered signal of the first training entry signal CSTMA_EN to a node nd471, in response to the first selected multipurpose command SMPCA and an output signal of the inverter IV471. The inverter IV473 may inversely buffer the second selected multipurpose command SMPCB and may output the inversely buffered signal as an output signal. The inverter IV474 may inversely buffer the second training entry signal CSTMA_EN to output the inversely buffered signal of the second training entry signal CSTMB_EN to the node nd471, in response to the second selected multipurpose command SMPCB and an output signal of the inverter IV473. The inverters IV475 and IV476 may constitute a latch circuit and may receive and buffer a signal of the node nd471 to output the buffered signal as a latch entry pulse LENP through a node nd472.

The latch exit pulse generation circuit 472 may include inverters IV481-IV486. The inverter IV481 may inversely buffer the first selected multipurpose command SMPCA and may output the inversely buffered signal as an output signal. The inverter IV482 may inversely buffer the first training exit signal CSTMA_EX to output the inversely buffered signal of the first training exit signal CSTMA_EX to a node nd473, in response to the first selected multipurpose command SMPCA and an output signal of the inverter IV481. The inverter IV483 may inversely buffer the second selected multipurpose command SMPCB and may output the inversely buffered signal as an output signal. The inverter IV484 may inversely buffer the second training exit signal CSTMB_EX to output the inversely buffered signal of the second training exit signal CSTMB_EX to the node nd473, in response to the second selected multipurpose command SMPCB and an output signal of the inverter IV483. The inverters IV485 and IV486 may constitute a latch circuit and may receive and buffer a signal of the node nd473 to output the buffered signal as a latch exit pulse LEXP through a node nd474.

The strobe pulse generation circuit 473 may include a NOR gate NOR491 and an inverter IV491 which are coupled in series. The strobe pulse generation circuit 473 may receive the first selected multipurpose command SMPCA and the second selected multipurpose command SMPCB and may execute a logical OR operation of the first and second selected multipurpose commands SMPCA and SMPCB to generate a strobe pulse SP. The strobe pulse generation circuit 473 may generate the strobe pulse SP having a logic "high" level if at least one of the first and second selected multipurpose commands SMPCA and SMPCB has a logic "high" level.

The start pulse generation circuit 474 may include a NAND gate NAND491 and an inverter IV492 which are coupled in series. The start pulse generation circuit 474 may receive the strobe pulse SP and the latch entry pulse LENP and may execute a logical AND operation of the strobe pulse SP and the latch entry pulse LENP to generate a start pulse STRP. The start pulse generation circuit 474 may generate the start pulse STRP from the latch entry pulse LENP in response to the strobe pulse SP. The start pulse generation circuit 474 may output the latch entry pulse LENP as the start pulse STRP if the strobe pulse SP having a logic "high" level is generated.

The end pulse generation circuit 475 may include a NAND gate NAND492 and an inverter IV493 which are coupled in series. The end pulse generation circuit 475 may receive the strobe pulse SP and the latch exit pulse LEXP and may execute a logical AND operation of the strobe pulse SP and the latch exit pulse LEXP to generate an end pulse ENDP. The end pulse generation circuit 475 may generate the end pulse ENDP from the latch exit pulse LEXP in response to the strobe pulse SP. The end pulse generation circuit 475 may output the latch exit pulse LEXP as the end pulse ENDP if the strobe pulse SP having a logic "high" level is generated.

The training signal output circuit 476 may include inverters IV494~IV497 and NAND gates NAND493 and NAND494. The training signal output circuit 476 may generate the training signal CS_TR in response to the start pulse STRP and the end pulse ENDP. The training signal output circuit 476 may generate the training signal CS_TR which is enabled to have a logic "high" level if the start pulse STRP having a logic "high" level is generated. The training signal output circuit 476 may generate the training signal CS_TR which is disabled to have a logic "low" level if the end pulse ENDP having a logic "high" level is generated. The training signal output circuit 476 may also be configured to receive a reset signal RSTB.

Operations of the semiconductor device having the aforementioned configuration will be described hereinafter with reference to FIGS. 13 and 14 in conjunction with an embodiment in which the multipurpose command MPCMD is enabled during a period corresponding to "N" times a cycle time of the clock signal CLK and an embodiment in which the multipurpose command MPCMD is enabled during a period corresponding to a cycle time of the clock signal CLK.

Figure 13:
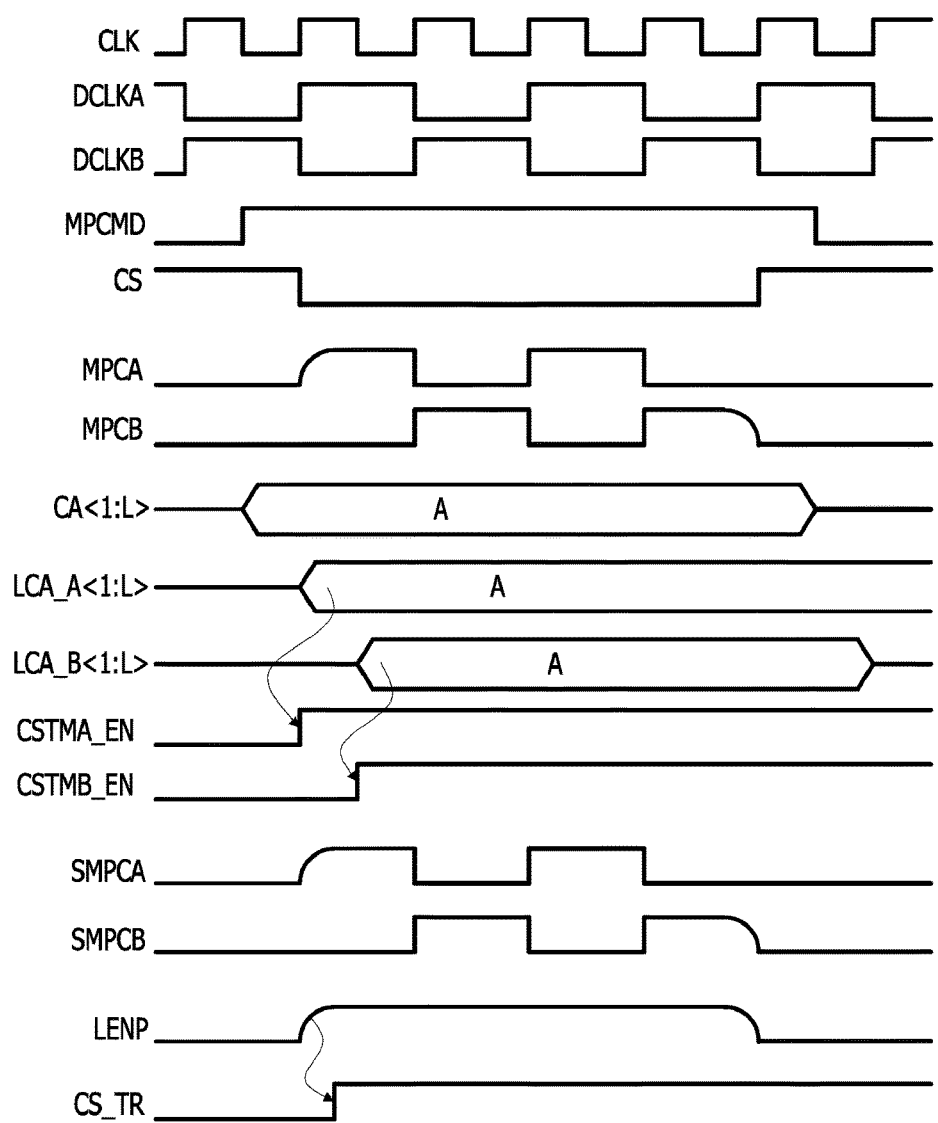
FIGS. 13 and 14 are timing diagrams illustrating operations of the semiconductor device shown in FIGS. 1 to 12.

As illustrated in FIG. 13, if the multipurpose command MPCMD is a signal which is enabled during a period corresponding to "N" times a cycle time of the clock signal CLK, the first division clock signal DCLKA and the second division clock signal DCLKB generated by dividing the clock signal CLK may be respectively latched to generate the first latched multipurpose command MPCA and the second latched multipurpose command MPCB while the multipurpose command MPCMD is enabled. The chip selection signal CS may have a logic "low" level in a period that the multipurpose command MPCMD is enabled to have a logic "high" level. The control signal CA<1:L> having a logic level combination 'A' may be latched in synchronization with the first division clock signal DCLKA to generate the first latched control signal LCA_A<1:L>, and the first latched control signal LCA_A<1:L> may be selected and decoded to generate the first training entry signal CSTMA_EN which is enabled to have a logic "high" level. The control signal CA<1:L> having the logic level combination 'A' may be latched in synchronization with the second division clock signal DCLKB to generate the second latched control signal LCA_B<1:L>, and the second latched control signal LCA_B<1:L> may be selected and decoded to generate the second training entry signal CSTMB_EN which is enabled to have a logic "high" level. The first latched multipurpose command MPCA and the second latched multipurpose command MPCB may be selected and provided as the first selected multipurpose command SMPCA and the second selected multipurpose command SMPCB, respectively. The first latched multipurpose command MPCA, as the first selected multipurpose command SMPCA, may be provided as the latch entry pulse LENP while the first training entry signal CSTMA_EN is enabled to have a logic "high" level, and the second latched multipurpose command MPCB, as the second selected multipurpose command SMPCB, may be provided as the latch entry pulse LENP while the second training entry signal CSTMB_EN is enabled to have a logic "high" level. The training signal CS_TR may be enabled to have a logic "high" level at a generation moment of the latch entry pulse LENP so that an application timing of the chip selection signal CS is controlled to start a training operation for verifying a period that the chip selection signal CS is stably applied.

Figure 14:
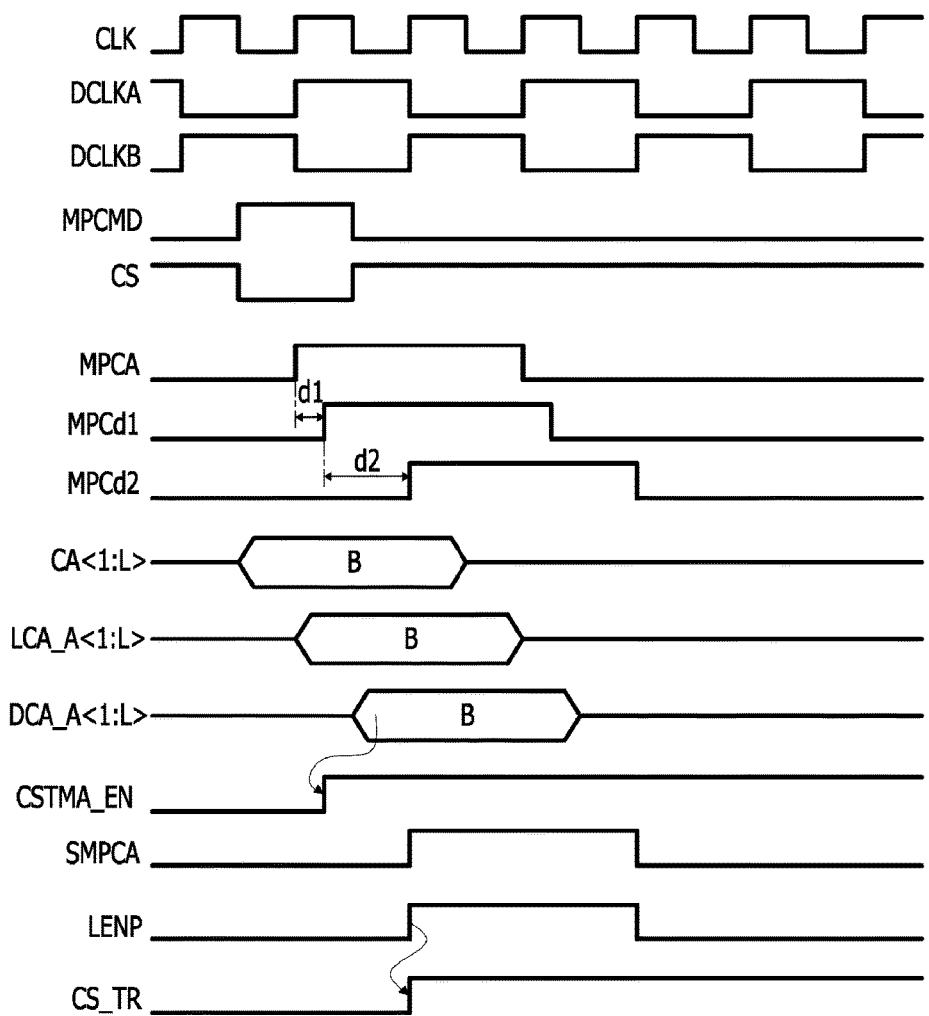

As illustrated in FIG. 14, if the multipurpose command MPCMD is a signal which is enabled during a single cycle time of the clock signal CLK, the first division clock signal DCLKA generated by dividing the clock signal CLK may be latched to generate the first latched multipurpose command MPCA. The chip selection signal CS may have a logic "low" level during a period that the multipurpose command MPCMD is enabled to have a logic "high" level. The first latched multipurpose command MPCA may be delayed by a first delay time d1 to generate the first delayed multipurpose command MPCd1, and the first delayed multipurpose command MPCd1 may be delayed by a second delay time d2 to generate the second delayed multipurpose command MPCd2. The control signal CA<1:L> having a logic level combination 'B' may be latched in synchronization with the first division clock signal DCLKA to generate the first latched control signal LCA_A<1:L>. The first latched control signal LCA_A<1:L> having the logic level combination 'B' may be latched in synchronization with the first delayed multipurpose command MPCd1 to generate the first delayed control signal DCA_A<1:L>, and the first delayed control signal DCA_A<1:L> may be selected and decoded to generate the first training entry signal CSTMA_EN which is enabled to have a logic "high" level. The second delayed multipurpose command MPCd2 may be selected and provided as the first selected multipurpose command SMPCA. The second delayed multipurpose command MPCd2, as the first selected multipurpose command SMPCA, may be provided as the latch entry pulse LENP while the first training entry signal CSTMA_EN is enabled to have a logic "high"

level. The training signal CS_TR may be enabled to have a logic "high" level at a generation moment of the latch entry pulse LENP so that an application timing of the chip selection signal CS is controlled to start a training operation for verifying a period that the chip selection signal CS is stably applied. In FIG. 14, the second division clock signal DCLKB that may also be generated by dividing the clock signal CLK is also illustrated.

As described above, if the multipurpose command MPCMD is enabled during a single cycle time of the clock signal CLK, it may be impossible for the multipurpose command MPCMD to have an enablement period long enough to guarantee a setup time and a hold time for the chip selection signal CS. Thus, the semiconductor device according to an embodiment may delay the first latched multipurpose command MPCA to generate the first delayed multipurpose command MPCd1, may latch the first latched control signal LCA_A<1:L> in synchronization with the first delayed multipurpose command MPCd1 to stably generate the first training entry signal CSTMA_EN which is enabled, may delay the first latched multipurpose command MPCA to generate the second delayed multipurpose command MPCd2, and may generate the training signal CS_TR which is stably enabled using the second delayed multipurpose command MPCd2. As a result, even though the multipurpose command MPCMD is enabled during a relatively short period, the training signal CS_TR may be stably generated.

Figure 15:
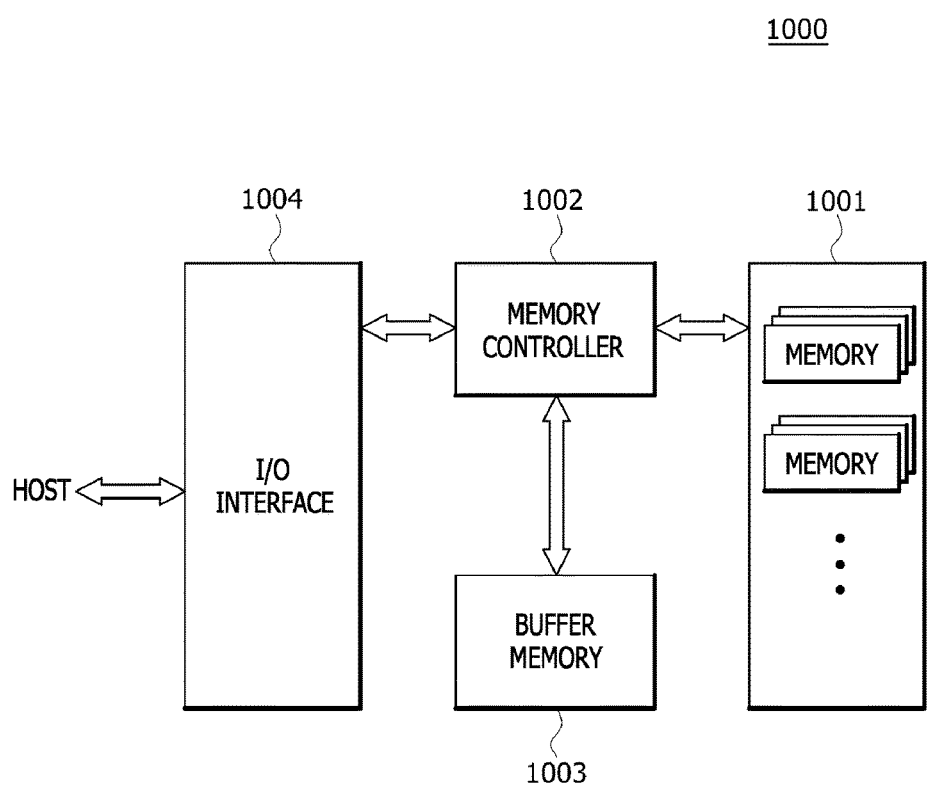
FIG. 15 is a block diagram illustrating a configuration of an example of an electronic system employing the semiconductor device shown in FIG. 1.

The semiconductor device described with reference to FIG. 1 may be applied to an electronic system that includes a memory system, a graphic system, a computing system, a mobile system, or the like. For example, as illustrated in FIG. 15, an electronic system 1000 according an embodiment may include a data storage circuit 1001, a memory controller 1002, a buffer memory 1003, and an input/output (I/O) interface 1004.

The data storage circuit 1001 may store data which are outputted from the memory controller 1002 or may read and output the stored data to the memory controller 1002, according to a control signal generated by the memory controller 1002. The data storage circuit 1001 may include the semiconductor device illustrated in FIG. 1. Meanwhile, the data storage circuit 1001 may include a nonvolatile memory that can retain their stored data even when its power supply is interrupted. The nonvolatile memory may be a flash memory such as a NOR-type flash memory or a NAND-type flash memory, a phase change random access memory (PRAM), a resistive random access memory (RRAM), a spin transfer torque random access memory (STTRAM), a magnetic random access memory (MRAM), or the like.

The memory controller 1002 may receive a command outputted from an external device (e.g., a host device) through the I/O interface 1004 and may decode the command outputted from the host device to control an operation for inputting data into the data storage circuit 1001 or the buffer memory 1003 or for outputting the data stored in the data storage circuit 1001 or the buffer memory 1003. Although FIG. 15 illustrates the memory controller 1002 with a single block, the memory controller 1002 may include one controller for controlling the data storage circuit 1001 comprised of a nonvolatile memory and another controller for controlling the buffer memory 1003 comprised of a volatile memory.

The buffer memory 1003 may temporarily store the data which are processed by the memory controller 1002. That is, the buffer memory 1003 may temporarily store the data which are outputted from or to be inputted to the data storage circuit 1001. The buffer memory 1003 may store the data, which are outputted from the memory controller 1002, according to a control signal. The buffer memory 1003 may read and output the stored data to the memory controller 1002. The buffer memory 1003 may include a volatile memory such as a dynamic random access memory (DRAM), a mobile DRAM, or a static random access memory (SRAM).

The I/O interface 1004 may physically and electrically connect the memory controller 1002 to the external device (i.e., the host). Thus, the memory controller 1002 may receive control signals and data supplied from the external device (i.e., the host) through the I/O interface 1004 and may output the data generated from the memory controller 1002 to the external device (i.e., the host) through the I/O interface 1004. That is, the electronic system 1000 may communicate with the host through the I/O interface 1004. The I/O interface 1004 may include any one of various interface protocols such as a universal serial bus (USB), a multimedia card (MMC), a peripheral component interconnect-express (PCI-E), a serial attached SCSI (SAS), a serial AT attachment (SATA), a parallel AT attachment (PATA), a small computer system interface (SCSI), an enhanced small device interface (ESDI), and an integrated drive electronics (IDE).

The electronic system 1000 may be used as an auxiliary storage device of the host or an external storage device. The electronic system 1000 may include a solid state disk (SSD), a USB memory, a secure digital (SD) card, a mini secure digital (miniSD) card, a micro secure digital (microSD) card, a secure digital high capacity (SDHC) card, a memory stick card, a smart media (SM) card, a multi-media card (MMC), an embedded multi-media card (eMMC), a compact flash (CF) card, or the like.

What is claimed is:

1. A semiconductor device comprising:
a training control circuit configured to generate a training signal for executing a training operation of a chip selection signal from a first latched multipurpose command and a first latched control signal,
wherein the training control circuit is configured to delay the first latched multipurpose command to generate a first delayed multipurpose command and a second delayed multipurpose command,
wherein if a multipurpose command is enabled during a period corresponding to "N" times a cycle time of a clock signal, the training control circuit is configured to decode the first latched control signal to generate a first training entry signal and configured to generate the training signal which is enabled from the first latched multipurpose command in response to the first training entry signal, and
wherein if the multipurpose command is enabled during a period corresponding to the cycle time of the clock signal, the training control circuit is configured to latch the first latched control signal in response to the first delayed multipurpose command, configured to decode the latched signal of the first latched control signal to generate the first training entry signal, and configured to generate the training signal which is enabled from the second delayed multipurpose command in response to the first training entry signal.

2. The semiconductor device of claim 1, wherein the first latched multipurpose command is generated by latching a first division clock signal based on the clock signal while the multipurpose command is enabled.

3. The semiconductor device of claim 1, wherein the first latched control signal is generated by latching a control signal in synchronization with a first division clock signal based on the clock signal.

4. The semiconductor device of claim 3, wherein the control signal includes at least one of a command and an address.

5. The semiconductor device of claim 1, wherein the training control circuit includes:
- a command delay circuit configured to delay the first latched multipurpose command to generate the first delayed multipurpose command and the second delayed multipurpose command;
- an entry/exit control circuit configured to generate the first training entry signal and a first training exit signal from the first latched control signal and the first delayed multipurpose command based on a training flag;
- a selected multipurpose command generation circuit configured to generate a first selected multipurpose command from the first latched multipurpose command and the second delayed multipurpose command based on the training flag; and
- a training signal generation circuit configured to generate the training signal in response to the first training entry signal, the first training exit signal, and the first selected multipurpose command.

6. The semiconductor device of claim 5, wherein the command delay circuit is configured to delay the first latched multipurpose command by a first delay time to generate the first delayed multipurpose command and is configured to delay the first delayed multipurpose command by a second delay time to generate the second delayed multipurpose command.

7. The semiconductor device of claim 5,
- wherein the training flag has a first logic level if the multipurpose command is enabled during a period corresponding to "N" times the cycle time of the clock signal; and
- wherein the training flag has a second logic level if the multipurpose command is enabled during a period corresponding to the cycle time of the clock signal.

8. The semiconductor device of claim 7,
- wherein the entry/exit control circuit decodes the first latched control signal to generate the first training entry signal and the first training exit signal if the training flag has the first logic level; and
- wherein the entry/exit control circuit latches the first latched control signal in synchronization with the first delayed multipurpose command and decodes the latched signal of the first latched control signal to generate the first training entry signal and the first training exit signal if the training flag has the second logic level.

9. The semiconductor device of claim 7,
- wherein the selected multipurpose command generation circuit outputs the first latched multipurpose command as the first selected multipurpose command if the training flag has the first logic level; and
- wherein the selected multipurpose command generation circuit outputs the second delayed multipurpose command as the first selected multipurpose command if the training flag has the second logic level.

10. The semiconductor device of claim 1,
- wherein the training control circuit is configured to generate the training signal for executing the training operation of the chip selection signal from a second latched multipurpose command and a second latched control signal;
- wherein the training control circuit is configured to delay the second latched multipurpose command to generate a third delayed multipurpose command and a fourth delayed multipurpose command;
- wherein if the multipurpose command is enabled during a period corresponding to "N" times the cycle time of the clock signal, the training control circuit is configured to decode the second latched control signal to generate a second training entry signal and configured to generate the training signal which is enabled from the second latched multipurpose command in response to the second training entry signal; and
- wherein if the multipurpose command is enabled during a period corresponding to the cycle time of the clock signal, the training control circuit is configured to latch the second latched control signal in response to the third delayed multipurpose command, configured to decode the latched signal of the second latched control signal to generate the second training entry signal, and configured to generate the training signal which is enabled from the fourth delayed multipurpose command in response to the second training entry signal.

11. The semiconductor device of claim 10,
- wherein the second latched multipurpose command is generated by latching a second division clock signal based on the clock signal while the multipurpose command is enabled; and
- wherein the second latched control signal is generated by latching a control signal in synchronization with the second division clock signal.

12. The semiconductor device of claim 10, wherein the training control circuit includes:
- a command delay circuit configured to delay the second latched multipurpose command to generate the third delayed multipurpose command and the fourth delayed multipurpose command;
- an entry/exit control circuit configured to generate the second training entry signal and a training exit signal from the second latched control signal and the third delayed multipurpose command based on a training flag;
- a selected multipurpose command generation circuit configured to generate a selected multipurpose command from the second latched multipurpose command and the fourth delayed multipurpose command based on the training flag; and
- a training signal generation circuit configured to generate the training signal in response to the second training entry signal, the training exit signal, and the selected multipurpose command.

13. A semiconductor device comprising:
- a multipurpose command latch circuit configured to latch a first division clock signal based on a multipurpose command to generate a first latched multipurpose command;
- a latched control signal generation circuit configured to latch a control signal in synchronization with the first division clock signal to generate a first latched control signal; and
- a training control circuit configured to generate a training signal for executing a training operation of a chip selection signal from a first latched multipurpose command and a first latched control signal based on a training flag.

14. The semiconductor device of claim 13,
wherein the training flag has a first logic level if the multipurpose command is enabled during a period corresponding to "N" times a cycle time of a clock signal; and
wherein the training flag has a second logic level if the multipurpose command is enabled during a period corresponding to the cycle time of the clock signal.

15. The semiconductor device of claim 13, wherein the control signal includes at least one of a command and an address.

16. The semiconductor device of claim 13,
wherein the training control circuit is configured to delay the first latched multipurpose command to generate a first delayed multipurpose command and a second delayed multipurpose command;
wherein if the training flag has a first logic level, the training control circuit is configured to decode the first latched control signal to generate a first training entry signal and configured to generate the training signal which is enabled from the first latched multipurpose command in response to the first training entry signal; and
wherein if the training flag has a second logic level, the training control circuit is configured to latch the first latched control signal in response to the first delayed multipurpose command, configured to decode the latched signal of the first latched control signal to generate the first training entry signal, and configured to generate the training signal which is enabled from the second delayed multipurpose command in response to the first training entry signal.

17. The semiconductor device of claim 13, wherein the training control circuit includes:
a command delay circuit configured to delay the first latched multipurpose command to generate a first delayed multipurpose command and a second delayed multipurpose command;
an entry/exit control circuit configured to generate a first training entry signal and a first training exit signal from the first latched control signal and the first delayed multipurpose command based on the training flag;
a selected multipurpose command generation circuit configured to generate a first selected multipurpose command from the first latched multipurpose command and the second delayed multipurpose command based on the training flag; and
a training signal generation circuit configured to generate the training signal in response to the first training entry signal, the first training exit signal, and the first selected multipurpose command.

18. The semiconductor device of claim 17, wherein the command delay circuit is configured to delay the first latched multipurpose command by a first delay time to generate the first delayed multipurpose command and is configured to delay the first delayed multipurpose command by a second delay time to generate the second delayed multipurpose command.

19. The semiconductor device of claim 17,
wherein the entry/exit control circuit decodes the first latched control signal to generate the first training entry signal and the first training exit signal if the training flag has a first logic level; and
wherein the entry/exit control circuit latches the first latched control signal in synchronization with the first delayed multipurpose command and decodes the latched signal of the first latched control signal to generate the first training entry signal and the first training exit signal if the training flag has a second logic level.

20. The semiconductor device of claim 17,
wherein the selected multipurpose command generation circuit outputs the first latched multipurpose command as the first selected multipurpose command if the training flag has a first logic level; and
wherein the selected multipurpose command generation circuit outputs the second delayed multipurpose command as the first selected multipurpose command if the training flag has a second logic level.

* * * * *